United States Patent
Chen

(10) Patent No.: US 11,003,617 B2
(45) Date of Patent: May 11, 2021

(54) USB CONTROL CIRCUIT UTILIZING A SINGLE CONFIGURATION PIN

(71) Applicant: REALTEK SEMICONDUCTOR CORPORATION, Hsinchu (TW)

(72) Inventor: Leaf Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/683,320

(22) Filed: Nov. 14, 2019

(65) Prior Publication Data
US 2020/0174961 A1 Jun. 4, 2020

(30) Foreign Application Priority Data
Dec. 3, 2018 (TW) ................................. 107143314

(51) Int. Cl.
*G06F 13/42* (2006.01)
*H03K 17/687* (2006.01)

(52) U.S. Cl.
CPC ..... *G06F 13/4282* (2013.01); *H03K 17/6871* (2013.01); *G06F 2213/0042* (2013.01)

(58) Field of Classification Search
CPC ........ G06F 13/4282; G06F 2213/0042; H03K 17/6871
USPC .............................. 710/15, 36, 62, 104–105
See application file for complete search history.

(56) References Cited

U.S. PATENT DOCUMENTS

| 5,920,734 | A | * | 7/1999 | Holmdahl | G06F 3/0383 361/601 |
|---|---|---|---|---|---|
| 8,270,840 | B2 | | 9/2012 | Lai | |
| 10,128,831 | B1 | * | 11/2018 | Lam | H03K 17/223 |
| 10,483,757 | B1 | * | 11/2019 | Banak | H02H 9/025 |
| 2005/0001594 | A1 | * | 1/2005 | Felder | H02J 7/00308 320/134 |
| 2007/0204178 | A1 | * | 8/2007 | Nishigata | G06F 1/263 713/300 |

(Continued)

FOREIGN PATENT DOCUMENTS

CN      102045112 A      5/2011

OTHER PUBLICATIONS

OA letter of the counterpart CN application (appl. No. 201811502581.3) mailed on Dec. 28, 2020. Summary of the OA letter: Claim 1 is rejected under Patent Act 22-3 as being unpatentable over D1.

*Primary Examiner* — Idriss N Alrobaye
*Assistant Examiner* — Henry W Yu
(74) *Attorney, Agent, or Firm* — WPAT, PC

(57) ABSTRACT

The invention discloses a control circuit applied to a Universal Serial Bus (USB) which includes a first channel configuration pin and a second channel configuration pin. The control circuit includes: a first transistor having a first control terminal; a first resistor group coupled to the first channel configuration pin and the first transistor; a first Schottky diode having a first end and a second end, the first end being coupled to the first control terminal; a second transistor having a second control terminal; a second resistor group coupled to the second channel configuration pin and the second transistor; and a second Schottky diode having a third end and a fourth end, the third end being coupled to the second control terminal, and the fourth end being coupled to the second end of the first Schottky diode.

15 Claims, 3 Drawing Sheets

(56) References Cited

U.S. PATENT DOCUMENTS

| | | | |
|---|---|---|---|
| 2014/0117784 A1* | 5/2014 | Weissinger, Jr. ... | H01M 10/425 307/150 |
| 2015/0123641 A1* | 5/2015 | Dalton ............... | A61B 5/14546 323/299 |
| 2016/0092393 A1* | 3/2016 | Nge .................... | G06F 13/4068 710/14 |
| 2017/0024350 A1* | 1/2017 | Burgers ............. | G06F 13/4072 |
| 2017/0085102 A1* | 3/2017 | Wu ...................... | H02J 7/0045 |
| 2017/0156184 A1* | 6/2017 | Knoedgen ............. | H05B 45/37 |
| 2017/0336819 A1* | 11/2017 | Pons ..................... | H01R 24/60 |

\* cited by examiner

USB CONTROL CIRCUIT UTILIZING A SINGLE CONFIGURATION PIN

BACKGROUND OF THE INVENTION

1. Field of the Invention

The present invention generally relates to Universal Serial Bus (USB) and, more particularly, to USB control circuits.

2. Description of Related Art

Universal Serial Bus (USB) Type-C has two channel configuration pins: the first channel configuration pin (hereinafter referred to as CC1 pin) and the second channel configuration pin (hereinafter referred to as CC2 pin). When first USB equipment (e.g., a host or a device) is connected to second USB equipment (e.g., a device or a host), the first USB equipment may need to receive power from the second USB equipment (e.g., the first USB equipment is a mobile phone, and the second USB equipment is a computer), or the first USB device does not need to receive power from the second USB equipment (e.g., the first USB equipment is a monitor and the second USB equipment is a mobile phone). According to the USB type-C specifications, in cases where the first USB equipment needs to receive power from the second USB equipment, the first USB equipment which does not contain any power source is required to have the capability of pulling down the electric potential(s) of the CC1 pin and/or the CC2 pin to be lower than a preset value, whereas in cases where the first USB equipment does not need to receive power from the second USB equipment, the first USB equipment should not pull down the electric potential(s) of the CC1 pin and/or the CC2 pin.

The conventional USB type-C control chip uses two pins to respectively control the CC1 pin and the CC2 pin, that is, the conventional USB type-C control circuit controls the CC1 pin and the CC2 pin individually, which increases the circuit area and cost of the control chip. However, if the USB control chip uses a single pin to control both the CC1 pin and the CC2 pin, the input resistance of the CC1 pin or the CC2 pin may probably fail to conform to the USB type-C specifications. Therefore, a USB control circuit is provided in present invention to address this problem.

SUMMARY OF THE INVENTION

In view of the issues of the prior art, an object of the present invention is to provide a USB control circuit that needs only small circuit area and is cost effective, so as to make an improvement to the prior art.

A universal serial bus (USB) control circuit is provided. The USB control circuit is applied to a USB that includes a first channel configuration pin and a second channel configuration pin. The USB control circuit includes a first transistor, a first resistor group, a first Schottky diode, a second transistor, a second resistor group and a second Schottky diode. The first transistor has a first control terminal. The first resistor group is coupled to the first channel configuration pin and the first transistor. The first Schottky diode has a first end and a second end, and the first end is coupled to the first control terminal. The second transistor has a second control terminal. The second resistor group is coupled to the second channel configuration pin and the second transistor. The second Schottky diode has a third end and a fourth end. The third end is coupled to the second control terminal, and the fourth end is coupled to the second end of the first Schottky diode.

A USB control circuit is also provided. The USB control circuit is applied to a USB that includes a first channel configuration pin and a second channel configuration pin. The USB control circuit includes a first transistor, a first resistor group, a second transistor, a second resistor group, a third transistor, a fourth transistor and a bias circuit. The first transistor has a first control terminal. The first resistor group is coupled to the first channel configuration pin and the first transistor. The second transistor has a second control terminal. The second resistor group is coupled to the second channel configuration pin and the second transistor. The third transistor has a first end and a second end, and the first end is coupled to the first control terminal. The fourth transistor has a third end and a fourth end. The third end is coupled to the second control terminal, and the fourth end is coupled to the second end of the third transistor. The bias circuit is coupled to the first channel configuration pin, the second channel configuration pin, the second end of the third transistor and the fourth end of the fourth transistor, and is configured to provide a bias voltage to the second end of the third transistor and the fourth end of the fourth transistor according to a voltage on the first channel configuration pin and/or the second channel configuration pin.

The present invention discloses a USB control circuit that uses a single pin to control the CC1 pin and the CC2 pin of USB type-C. Compared with the conventional technology, the USB control circuit of the present invention not only has a lower cost and a smaller circuit area but also allows the input impedance of the CC1 pin and the CC2 pin to be separately adjusted.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes USB control circuits. On account of that some or all elements of the USB control circuits could be known, the detail of such elements is omitted provided that such detail has little to do with the features of this disclosure and this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
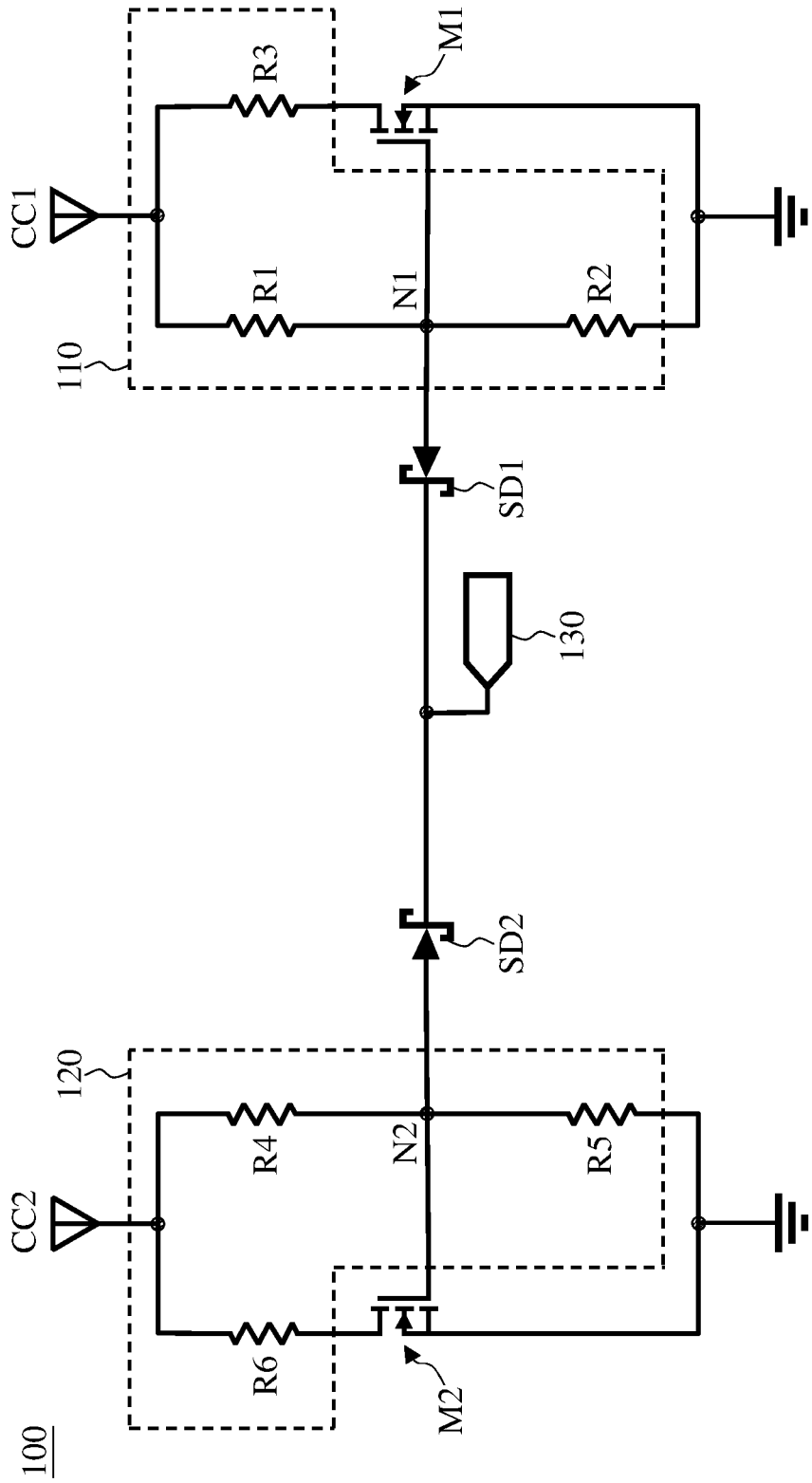
FIG. 1 illustrates a circuit diagram of a USB control circuit according to an embodiment of the present invention.

FIG. 1 is a circuit diagram of a USB control circuit according to an embodiment of the present invention. The USB control circuit 100 is a part of a USB control chip, and the pin 130 is one of the pins of the USB control chip. The pin 130 can also be regarded as the output/input of the USB control circuit 100. The pin 130 is shared by the CC1 pin and the CC2 pin. The USB control circuit 100 includes a resistor group 110, a transistor M1, a Schottky diode SD1, a resistor group 120, a transistor M2, and a Schottky diode SD2.

The control terminal (gate) of the transistor M1 is electrically connected to the node N1, and the source of the transistor M1 is coupled to a reference voltage, which may be, but not limited to, the ground level. The anode of the Schottky diode SD1 is electrically connected to the node N1 (i.e., coupled to the control terminal of the transistor M1), and the cathode of the Schottky diode SD1 is electrically connected to the pin 130. The resistor group 110, which includes a resistor R1, a resistor R2, and a resistor R3, is coupled to the CC1 pin and the transistor M1. The resistor R1 is coupled between the CC1 pin and the node N1, the resistor R2 is coupled between the node N1 and the reference voltage, and the resistor R3 is coupled between the CC1 pin and the drain of the transistor M1.

The control terminal (gate) of the transistor M2 is electrically connected to the node N2, and the source of the transistor M2 is coupled to the reference voltage. The anode of the Schottky diode SD2 is electrically connected to the node N2 (i.e., coupled to the control terminal of the transistor M2), and the cathode of the Schottky diode SD2 is electrically connected to the pin 130 and the cathode of the Schottky diode SD1. The resistor group 120, which includes a resistor R4, a resistor R5, and a resistor R6, is coupled to the CC2 pin and the transistor M2. The resistor R4 is coupled between the CC2 pin and the node N2, the resistor R5 is coupled between the node N2 and the reference voltage, and the resistor R6 is coupled between the CC2 pin and the drain of the transistor M2.

The USB control circuit 100 operates differently when used in different application scenarios: (1) when applied to a piece of USB equipment that receives power from another piece of USB equipment; and (2) when applied to a piece of USB equipment that does not receive power from another piece of USB equipment. The operation details for the two cases are discussed as follows.

In case (1), the pin 130 is floating, and the CC1 pin and/or the CC2 pin are/is coupled to a voltage source (e.g., 3.3V or 5V). The resistance value of the resistor R2 can be designed to be much larger than the resistance value of the resistor R1 (i.e., R2>>R1, for example, R1=1 Mohm, R2=9 Mohm); in this way, the voltage at the node N1 is greater than the threshold voltage of the transistor M1, causing the transistor M1 to be turned on. When the transistor M1 is turned on, the electric potential of the CC1 pin is pulled low. As a result, another piece of USB equipment knows that the USB equipment on which the USB control circuit 100 is mounted requires power and starts to supply power accordingly. The operations for the CC2 pin are similar to those for the CC1 pin and are omitted for brevity.

In case (2), the pin 130 is coupled to the reference voltage, and the CC1 pin and/or the CC2 pin are/is coupled to the voltage source (e.g., 3.3V or 5V). Since the voltage at the node N1 is higher than the voltage on the pin 130 by only about the forward-bias voltage of the Schottky diode SD1 (about 0.4V), the transistor M1 is not turned on (because the gate-source voltage Vgs of the transistor M1 is about 0.4V, which is smaller than the threshold voltage Vt=0.7V). As a result, the electric potential of the CC1 pin is not pulled low. The operations for the CC2 pin are similar to those for the CC1 pin and are omitted for brevity.

Although the CC1 pin and the CC2 pin share the pin 130, they are still isolated by the Schottky diode SD1 and the Schottky diode SD2, so that the CC1 pin and the CC2 pin do not affect each other under certain circumstances. To be specific, in the event that the USB control circuit 100 does not include the Schottky diode SD1 and the Schottky diode SD2, the gate of the transistor M1 (or M2) discharges via the path: N1 (i.e., N2)→R4 (or R1)→R6 (or R3)→M2 (or M1) when both the CC1 pin and the CC2 pin are coupled to the voltage source and the pin 130 is floating. In other words, the Schottky diode SD1 and the Schottky diode SD2 electrically separate the CC1 pin and the CC2 pin to ensure that the transistor M1 (or M2) is not turned off in the above instance. Furthermore, since the Schottky diode has a relatively small forward-bias voltage compared to 0.7V of a regular diode, when the pin 130 is coupled to the reference voltage (in this instance, the transistor M1 and the transistor M2 are supposed to be turned off), the transistor M1 and transistor M2 will not be mistakenly turned on by the forward-bias voltage of the diode.

Figure 2:
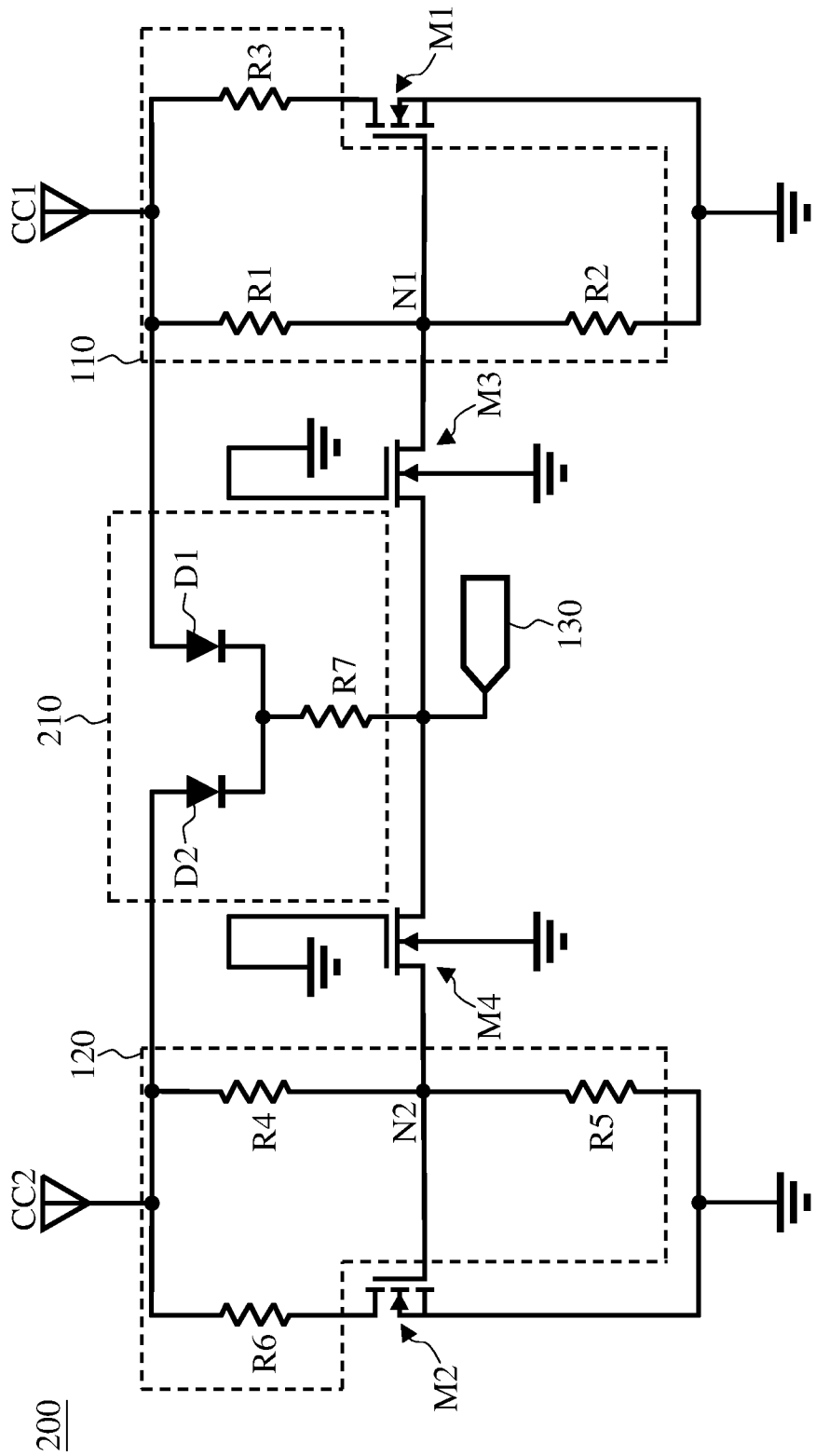
FIG. 2 illustrates a circuit diagram of a USB control circuit according to another embodiment of the present invention.

FIG. 2 is a circuit diagram of a USB control circuit according to another embodiment of the present invention. The USB control circuit 200 is part of the USB control chip, and the pin 130 is one of the pins of the USB control chip. The pin 130 can also be regarded as the output/input of the USB control circuit 200. The pin 130 is shared by the CC1 pin and the CC2 pin. The USB control circuit 200 includes a resistor group 110, a transistor M1, a transistor M3, a resistor group 120, a transistor M2, a transistor M4, and a bias circuit 210. In some embodiments, the transistors M1 and M2 are enhancement mode Metal-Oxide-Semiconductor Field-Effect Transistors (MOSFETs), and the transistors M3 and M4 are depletion mode MOSFETs. In addition, when the transistor M1 (or M2) is implemented by an N-type MOSFET (as shown in FIG. 2), the gate of the depletion mode transistor M3 (or M4) and the source of the transistor M1 (or M2) are both coupled to a reference voltage (such as ground). In other embodiments, the transistors M3 and M4 can also be implemented by enhancement mode MOSFETs or transistors of other types; in this instance, the gates of the transistors M3 and M4 are not coupled to the reference voltage, and additional electric potentials are needed to turn on the transistors M3 and M4.

Reference is still made to FIG. 2. The bias circuit 210 is coupled to the CC1 pin, the CC2 pin and the pin 130, and includes a diode D1, a diode D2, and a resistor R7. The resistor R7 is coupled to the pin 130, the diode D1 is coupled between the CC1 pin and the resistor R7, and the diode D2 is coupled between the CC2 pin and the resistor R7. The bias circuit 210 aims to provide a bias voltage to the pin 130 according to the voltage(s) of the CC1 pin and/or the CC2 pin, and to ensure that the voltage source to which the CC1 pin is coupled and the voltage source to which the CC2 pin is coupled do not affect each other. When the CC1 pin and/or the CC2 pin are/is coupled to the voltage source, the electric potential of the pin 130 is pulled high, which causes the depletion mode transistors M3 and M4 to be turned off.

The gates and the bodies (also referred to as bulk) of the depletion mode transistors M3 and M4 are coupled to the reference voltage. The drain of the depletion mode transistor M3 is electrically connected to the node N1 (i.e., coupled to the control terminal of the transistor M1), and the source of the depletion mode transistor M3 is electrically connected to the pin 130. The drain of the depletion mode transistor M4 is electrically connected to the node N2 (i.e., coupled to the control terminal of the transistor M2), and the source of the depletion mode transistor M4 is electrically connected to the pin 130 and the source of the depletion mode transistor M3. Similar to the Schottky diodes SD1 and SD2 of the USB control circuit 100, the depletion mode transistors M3 and M4 of the USB control circuit 200 can provide isolation. When the pin 130 is floating and the CC1 pin and/or the CC2 pin are/is coupled to the voltage source, the high voltage on the pin 130 turns off the depletion mode transistors M3 and M4. As a result, there is no leakage current on the gate(s) of the transistor(s) M1 and/or M2, which in turn ensures that the transistor(s) M1 and/or M2 remain(s) turned on. When the pin 130 is coupled to the reference voltage, the depletion mode transistors M3 and M4 are turned on, so that the voltages on the nodes N1 and N2 (i.e., the control terminals of the transistors M1 and M2) are reference voltages, which causes the transistors M1 and M2 to be turned off.

In the embodiments of FIG. 1 and FIG. 2, the resistance values of the resistors R1, R2 and R3 can be designed as R2>>R1>>R3>>Rds_M1 (where Rds_M1 is the turn-on resistance of the transistor M1), and the resistance values of the resistors R4, R5 and R6 can be designed as R5>>R4>>R6>>Rds_M2 (where Rds_M2 is the turn-on resistance of the transistor M2). In some embodiments, the difference between the resistance values of the resistors can be designed to be about 10 times or more and can be adjusted according to practical needs. With this design, the input impedance of the CC1 pin is about the resistance value of the resistor R3, and the input impedance of the CC2 pin is about the resistance value of the resistor R6 (ignoring Rds_M1 and Rds_M2). In other words, this circuit design allows the input impedances of the CC1 pin and the CC2 pin to be adjusted independently (i.e., the resistance values of the resistor R3 and the resistor R6 can be adjusted individually) to meet the USB type-C specifications.

Figure 3:
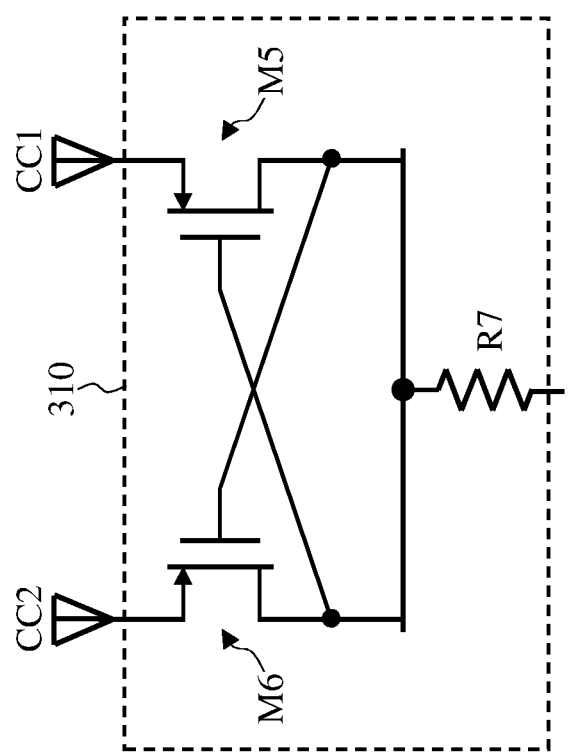
FIG. 3 illustrates a circuit diagram of the bias circuit in FIG. 2 according to another embodiment of the present invention.

FIG. 3 is a circuit diagram of the bias circuit according to another embodiment of the present invention. The bias circuit 310 includes a transistor M5 and a transistor M6 and can be used in place of the bias circuit 210 in FIG. 2. The transistor M5 is coupled between the CC1 pin and the resistor R7, and the transistor M6 is coupled between the CC2 pin and the resistor R7. The gate of the transistor M5 is coupled to the drain of the transistor M6, the source of the transistor M5 is coupled to the CC1 pin, and the drain of the transistor M5 is coupled to the resistor R7. The gate of the transistor M6 is coupled to the drain of the transistor M5, the source of the transistor M6 is coupled to the CC2 pin, and the drain of the transistor M6 is coupled to the resistor R7. The operation principles of the bias circuit in FIG. 3 are well known to those of ordinary skill in the art and are thus omitted for brevity.

In some embodiments, the transistors M1 and M2 are implemented by bipolar junction transistors (BJTs) instead of MOSFETs, with the base of the BJT being the control terminal. In addition, it is well known to those skilled in the art that the MOSFETs in FIG. 1 and FIG. 2 can also be implemented by P-type MOSFETs if the circuit is properly modified.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A control circuit applied to a universal serial bus (USB) which comprises
a first channel configuration pin and a second channel configuration pin, comprising:
a first transistor having a first control terminal;
a first resistor group coupled to the first channel configuration pin and the first transistor;
a first Schottky diode having a first end and a second end, the first end being coupled to the first control terminal;
a second transistor having a second control terminal;
a second resistor group coupled to the second channel configuration pin and the second transistor;
a second Schottky diode having a third end and a fourth end, the third end being coupled to the second control terminal, the fourth end being coupled to the second end of the first Schottky diode; and
a pin coupled to a cathode of the first Schottky diode and to a cathode of the second Schottky diode;
wherein the pin is coupled to the first control terminal of the first transistor through the first Schottky diode and coupled to the second control terminal of the second transistor through the second Schottky diode.

2. The control circuit of claim 1, wherein the first resistor group comprises:
a first resistor coupled between the first channel configuration pin and the first control terminal;
a second resistor coupled between the first control terminal and a reference voltage; and
a third resistor coupled between the first channel configuration pin and the first transistor.

3. The control circuit of claim 2, wherein the second resistor group comprises:
a fourth resistor coupled between the second channel configuration pin and the second control terminal;
a fifth resistor coupled between the second control terminal and the reference voltage; and
a sixth resistor coupled between the second channel configuration pin and the second transistor.

4. A control circuit applied to a universal serial bus (USB) which comprises
a first channel configuration pin and a second channel configuration pin, comprising:
a first transistor having a first control terminal;
a first resistor group coupled to the first channel configuration pin and the first transistor;
a second transistor having a second control terminal;
a second resistor group coupled to the second channel configuration pin and the second transistor;
a third transistor having a first end and a second end, the first end being coupled to the first control terminal;

a fourth transistor having a third end and a fourth end, the third end being coupled to the second control terminal, and the fourth end being coupled to the second end of the third transistor; and a bias circuit which is coupled to the first channel configuration pin, the second channel configuration pin, the second end of the third transistor and the fourth end of the fourth transistor, and is configured to provide a bias voltage to the second end of the third transistor and the fourth end of the fourth transistor according to a voltage on the first channel configuration pin and/or the second channel configuration pin;

wherein the bias voltage is not ground.

5. The control circuit of claim 4, wherein the third transistor is a depletion mode MOSFET and a gate of the depletion mode MOSFET is grounded.

6. The control circuit of claim 4, wherein the first resistor group comprises:

a first resistor coupled between the first channel configuration pin and the first control terminal;

a second resistor coupled between the first control terminal and a reference voltage; and a third resistor coupled between the first channel configuration pin and the first transistor.

7. The control circuit of claim 6, wherein the third transistor is a depletion mode MOSFET and a gate of the depletion mode MOSFET is grounded.

8. The control circuit of claim 6, wherein the second resistor group comprises:

a fourth resistor coupled between the second channel configuration pin and the second control terminal;

a fifth resistor coupled between the second control terminal and the reference voltage; and a sixth resistor coupled between the second channel configuration pin and the second transistor.

9. The control circuit of claim 8, wherein the third transistor is a depletion mode MOSFET and a gate of the depletion mode MOSFET is grounded.

10. The control circuit of claim 4, wherein the first transistor is an N-type MOSFET and a source of the N-type MOSFET is grounded.

11. The control circuit of claim 10, wherein the third transistor is a depletion mode MOSFET and a gate of the depletion mode MOSFET is grounded.

12. The control circuit of claim 4, wherein the bias circuit comprises:

a resistor coupled to the second end of the third transistor and the fourth end of the fourth transistor;

a first diode coupled between the first channel configuration pin and the resistor; and a second diode coupled between the second channel configuration pin and the resistor.

13. The control circuit of claim 12, wherein the third transistor is a depletion mode MOSFET and a gate of the depletion mode MOSFET is grounded.

14. The control circuit of claim 4, wherein the bias circuit comprises:

a resistor coupled to the second end of the third transistor and the fourth end of the fourth transistor;

a fifth transistor coupled between the first channel configuration pin and the resistor;

a sixth transistor coupled between the second channel configuration pin and the resistor; and wherein a gate of the fifth transistor is coupled to a drain of the sixth transistor, and a gate of the sixth transistor is coupled to a drain of the fifth transistor.

15. The control circuit of claim 14, wherein the third transistor is a depletion mode MOSFET and a gate of the depletion mode MOSFET is grounded.

* * * * *